(12) United States Patent
Karniewicz et al.

(10) Patent No.: US 10,587,261 B2
(45) Date of Patent: Mar. 10, 2020

(54) ELECTRICAL CIRCUIT FOR CONTROL OF AN ELECTRICAL DEVICE WITH HIGH INTEGRITY

(71) Applicant: Safran Electronics & Defense, Boulogne-Billancourt (FR)

(72) Inventors: Eric Karniewicz, Boulogne-Billancourt (FR); Michael Montoya, Boulogne-Billancourt (FR); Nicolas Charrier, Boulogne-Billancourt (FR); Nicolas Marti, Boulogne-Billancourt (FR)

(73) Assignee: SAFRAN ELECTRONICS & DEFENSE, Bologne-Billancourt (FR)

( * ) Notice: Subject to any disclaimer, the term of this patent is extended or adjusted under 35 U.S.C. 154(b) by 350 days.

(21) Appl. No.: 15/510,966

(22) PCT Filed: Sep. 15, 2015

(86) PCT No.: PCT/EP2015/071125
§ 371 (c)(1),
(2) Date: Mar. 13, 2017

(87) PCT Pub. No.: WO2016/041981
PCT Pub. Date: Mar. 24, 2016

(65) Prior Publication Data
US 2017/0264285 A1 Sep. 14, 2017

(30) Foreign Application Priority Data
Sep. 16, 2014 (FR) ..................................... 14 58745

(51) Int. Cl.
*H03K 17/567* (2006.01)
*H03K 17/74* (2006.01)
(Continued)

(52) U.S. Cl.
CPC .......... *H03K 17/567* (2013.01); *B64D 37/005* (2013.01); *H03K 17/60* (2013.01); *H03K 17/74* (2013.01); *H03K 2217/0009* (2013.01)

(58) Field of Classification Search
CPC ...... H03K 17/567; H03K 17/60; H03K 17/74; H03K 2217/0009; B64D 37/005
(Continued)

(56) References Cited

U.S. PATENT DOCUMENTS 4,864,214 A * 9/1989 Billings ........... H03K 17/04213
323/289
2017/0211413 A1* 7/2017 Montoya ................. F01D 21/02

FOREIGN PATENT DOCUMENTS

AU 2007 240 174 A1 1/2008
CN 201 173 551 Y 12/2008
(Continued)

OTHER PUBLICATIONS

International Search Report and Written Opinion in PCT/EP2015/071125 dated Nov. 30, 2015, with English translation.
(Continued)

*Primary Examiner* — Carlos Amaya
(74) *Attorney, Agent, or Firm* — Womble Bond Dickinson (US) LLP

(57) ABSTRACT

The invention relates to: Control circuit (1) for an electrical device (2), said control circuit (1) receiving as input a discrete electrical control signal (CMD), the control circuit (1) comprising a source (11) of voltage (±V) configured so as to supply the circuit according to a negative or positive voltage; a switch (12) normally closed in the absence of any discrete electrical control signal (CMD) and configured so as to isolate the electrical device from the voltage source as a function of the electrical control signal (CMD), said switch being connected between the voltage source and the elec-
(Continued)

Figure 1:
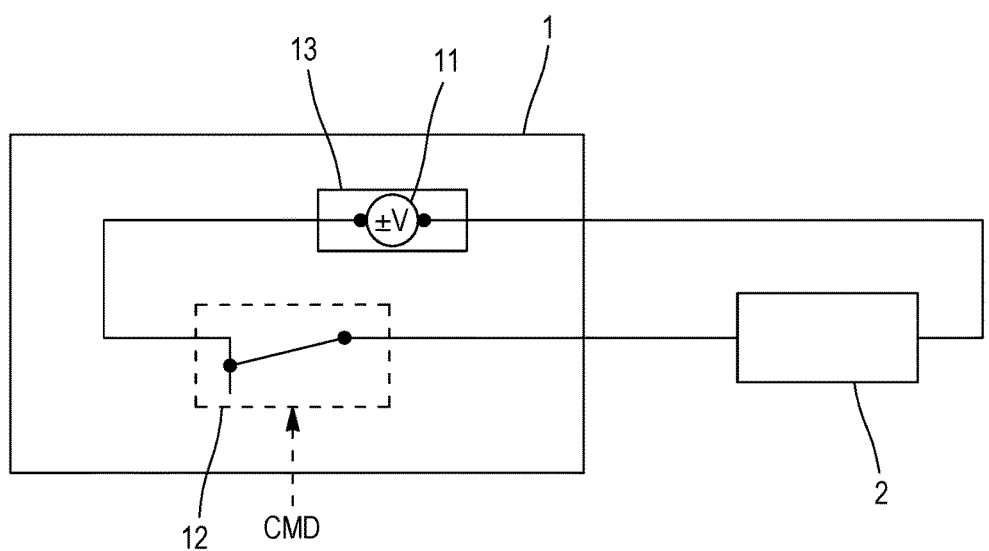

trical device (2); the switch (12) being sensitive to the discrete electrical control signal (CMD) for just one sense of voltage.

8 Claims, 2 Drawing Sheets

(51) Int. Cl.
*H03K 17/60* (2006.01)
*B64D 37/00* (2006.01)

(58) Field of Classification Search
USPC .......................................................... 307/9.1
See application file for complete search history.

(56) References Cited

FOREIGN PATENT DOCUMENTS

| | | |
|---|---|---|
| DE | 21 63 495 A1 | 7/1973 |
| FR | 2 969 862 A1 | 6/2012 |

OTHER PUBLICATIONS

Search Report in French Application No. 1458745 dated Jun. 19, 2015, with English translation coversheet.

\* cited by examiner

ELECTRICAL CIRCUIT FOR CONTROL OF AN ELECTRICAL DEVICE WITH HIGH INTEGRITY

GENERAL TECHNICAL FIELD AND STATE OF THE ART

The invention relates to the field of electronics and more particularly to that of the control of a piece of electric equipment integrated into an electric facility.

Electric devices controlled by so-called 'normally open' switches are known. In this case, a normally open switch is connected between a voltage source of the piece of electric equipment and the electric equipment. Thus, by controlling the normally open switch, it is possible to control the power supply of the piece of electric equipment.

In order to improve the control of the electric device, the latter may be controlled by so-called 'normally closed' switches. In this case, a normally closed switch is connected between a voltage source of the piece of electric equipment and the electric equipment. Thus, at rest, in the absence of any command, the normally closed switch controls the electric power supply of the piece of electric equipment, a command which allows disconnection of the electric power supply of the electric device.

However, these solutions are not satisfactory in terms of safety level, present implementations not being satisfactory.

PRESENTATION OF THE INVENTION

An object of the invention is to improve the control of a piece of electric equipment by means of a "normally closed" switch naturally, i.e. in the absence of any control.

For this purpose, the invention proposes a circuit for controlling a piece of electric equipment, said control circuit receiving as an input a discrete electric control signal, the control circuit comprising: a voltage source configured for powering the circuit according to a negative or positive voltage; a normally closed switch in the absence of any discrete electric control signal (CMD) and configured for insulating the piece of electric equipment from the voltage source depending on the electric control signal, said switch being connected between the voltage source and the piece of electric equipment; the switch being sensitive to the discrete electric control signal for a single voltage direction.

The invention is advantageously completed with the following characteristics, taken alone or in any of their technically possible combinations:

- the normally closed switch comprises a first NPN transistor controlled by the discrete electric control signal and a second NPN transistor, the collector of the first transistor being connected to the base of the second transistor, the emitter of the first transistor being connected to the emitter of the second transistor, the emitters being connected to the piece of equipment;
- the normally closed switch comprises a first resistor connected to the base of the first transistor, said first resistor giving the possibility of applying the electric control signal to said base of the first transistor;
- the normally closed switch comprises a second resistor connected between the base of the second transistor and the collector of the second transistor;
- the second transistor is a Darlington transistor;
- the circuit comprises a device for controlling the direction of the voltage delivered by the voltage source, preferably, mounted in parallel on the voltage source, said polarizer being configured for polarizing the voltage issued from the voltage source.

The invention also relates to an electric device for closing a fuel circuit of an aircraft powered by means of an electric power supply circuit according to the invention.

The advantages of the invention are multiple.

The device is not very cumbersome and reliable in terms of safety level. It is resistant to environmental notably thermal constraints and its response time is short. Finally its implementation is not very complex.

PRESENTATION OF THE FIGURES

Figure 2:
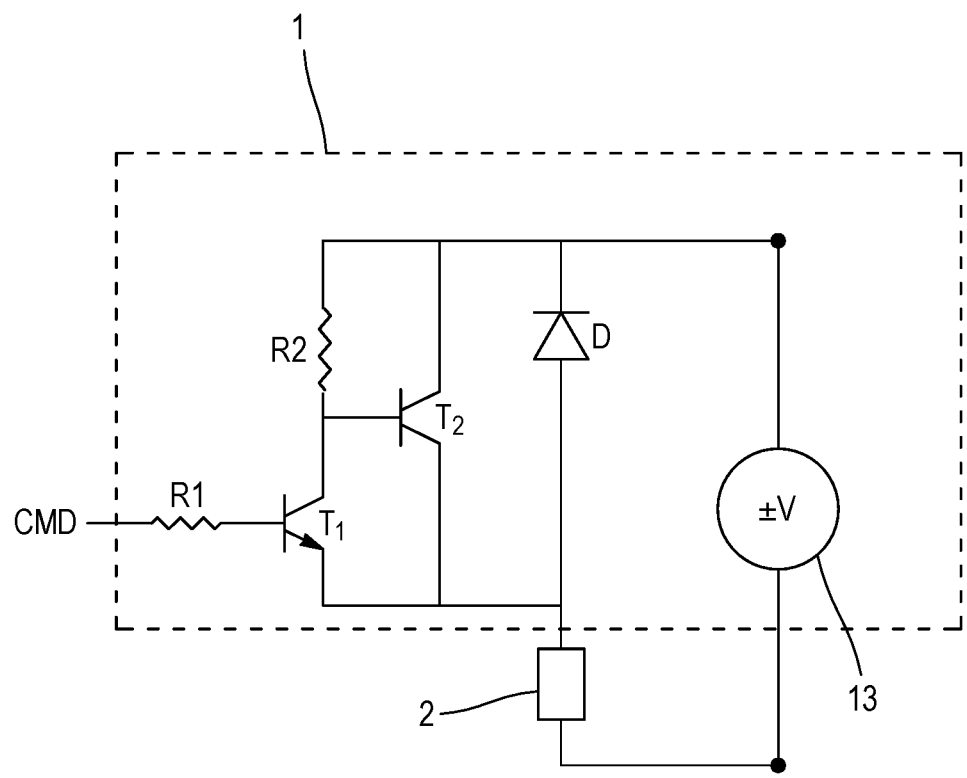

Other features, objects and advantages of the invention will emerge from the description which follows, which is purely illustrative and non-limiting, and which should be read with reference to the appended drawings wherein:

FIG. 1 schematically illustrates a circuit for controlling a safety piece of electric equipment according to the invention;

FIG. 2 illustrates an exemplary embodiment of a circuit for controlling a piece of electric equipment according to a preferred embodiment of the invention.

On the whole of the figures, similar elements bear identical references.

DETAILED DESCRIPTION OF THE INVENTION

FIG. 1 schematically illustrates a control circuit 1 of a piece of electric equipment 2 according to the invention.

The control circuit receives as an input a discrete electric control signal CMD. It is considered that the discrete electric control signal CMD is either a logic '1' signal or a logic '0' signal. It is considered that a discrete electric control signal CMD='0' is also assimilated to an absence of any command.

By piece of electric equipment 2 is meant here a bistable servomotor comprising two stable states. Indeed, it is considered that the piece of electric equipment 2 changes state as soon as its control is modified. It is also considered that the piece of electric equipment, as soon as it is no longer powered, maintains the position in which it was.

The control circuit in FIG. 1 comprises a voltage source 11 configured for issuing a voltage with an amplitude having as an absolute value |V| along a positive or negative direction. The voltage source 11 therefore issues a power supply voltage equal to ±V.

This voltage source 11 controls the piece of electric equipment 2. Indeed, depending on the direction of the voltage, the current passing through the piece of electric equipment is either positive or negative.

The control circuit also comprises a device 13 for controlling the direction of the voltage delivered by the voltage source which allows control of the direction of the voltage±V stemming from the voltage source 11. This device 13 for controlling the direction of the voltage delivered by the voltage source is preferably mounted in parallel on the voltage source.

The control circuit further comprises a normally closed switch 12 configured for insulating the piece of electric equipment 2 from the voltage source. The normally closed switch 12 is connected between the voltage source 11 and the piece of electric equipment 2.

It is considered that the normally closed switch 12 has a 'closed' state letting through a current and an 'open' state not letting through any current. Further, the normally closed switch is such that it is closed in the absence of a discrete electric control signal. The closed state is therefore the 'natural' state of this normally closed switch.

The control circuit 1 gives the possibility under certain conditions of insulating the piece of electric equipment 2 from the voltage source and therefore giving the possibility of leaving the piece of electric equipment 2 in the preceding state, i.e. when it was powered.

In particular, the switch 12 is sensitive to the discrete electric control signal CMD for a single direction of the voltage.

Accordingly, the normally closed switch 12 is in the 'closed' state regardless of the discrete electric control signal CMD (CMD='0' or CMD='1') for a single direction of the voltage.

It is considered here that the switch 12 is sensitive to the electric control signal CMD for a positive power supply voltage, equal to +V. This gives the possibility of having a strong integrity in the control of the piece of electric equipment.

Taking into account this operation, the normally closed switch 12 is:

'closed' regardless of the value of the discrete electric control signal CMD ('0' or '1') and when the power supply voltage is negative, equal to −V;

'open' when the power supply voltage is positive, equal to +V, and the discrete electric control signal CMD is in the '1' state;

'closed' when the power supply voltage is positive, equal to +V, and the discrete electric control signal CMD is in the '0' state.

Accordingly, one has an operation of the normally closed switch 12 which is inhibited for a power supply voltage equal to −V (negative bias).

In the following a possible application of such a control circuit is described.

It is considered that the piece of electric equipment 2 is a servomotor which depending on its position opens or closes a fuel circuit of the engine of an aircraft depending on the state of the aircraft.

A piece of electric equipment 2 of the servomotor type is for example a bistable electric shut-off valve (ESV) which gives the possibility of controlling the opening and the closing of the fuel addition into the engine of the aircraft.

In particular, for controlling the opening, a voltage in a first direction is needed and for controlling the closing, a voltage in the second direction, opposite to the first direction is necessary.

The states of the aircraft are for example:
starting of the engine: the ESV is open, fuel is sent into the fuel circuit,
engine started: the ESV is open, fuel is sent into the fuel circuit,
engine in a slow down or normal mode: the ESV is open, fuel is sent into the fuel circuit,
default: the ESV is closed, no fuel is sent into the fuel circuit.

It is considered that the electric control signal CMD characterizes the speed of the engine of the aircraft. Thus, upon starting CMD='0', engine started CMD='1', idling mode CMD='1', default CMD='0'.

The operation above is such that if it is desired to supply a fuel circuit of an aircraft under certain speed conditions of the engine and consequently depending on the state of the aircraft, the electric control signal CMD='0' is lost, the piece of electric equipment should close the fuel circuit.

Thus one has the following operation:
Starting mode: the voltage is negative, the power supply voltage is equal to '−V', the discrete electric control signal is equal to CMD='0'.
The normally closed switch is closed, the piece of electric equipment is supplied with a negative voltage (and therefore a negative current) corresponding to a power supply of the fuel circuit.
The engine may start.
Engine started mode: the voltage is negative, the power supply voltage is equal to '−V', the discrete electric control signal is equal to CMD='1'.
The normally closed switch is closed, the piece of electric equipment is powered by a negative voltage (and therefore a negative current) corresponding to a power supply of the fuel circuit.
The engine is started and is supplied with fuel.
Slow down or normal mode: the voltage is positive (the device for controlling the direction of the voltage changes the direction of the voltage), the power supply voltage is equal to '=+V', the discrete electric control signal is equal to CMD='1'.
The normally closed switch is open, the piece of electric equipment is no longer powered, the piece of electric equipment has not changed state.
The engine is started and is supplied with fuel.
Default mode: the voltage is positive, the power supply voltage is equal to '=+V', the discrete electric control signal is equal to CMD='0' subsequently to a loss of the speed information.
The normally closed switch closes, the piece of electric equipment is powered by a positive voltage, the piece of electric equipment changes state.
The engine is no longer supplied with fuel, the fuel circuit being closed.

In FIG. 2, a possible embodiment of the control circuit is illustrated as described above.

The voltage source issues a power supply voltage in one direction by means of the device 13 for controlling the direction of the voltage issued by the voltage source.

The normally closed switch comprises a first NPN transistor T1 controlled by the discrete electric control signal CMD and a second NPN transistor T2, the collector of the first transistor T1 is connected to the base of the second transistor T2.

Further, the emitter of the first transistor T1 is connected to the emitter of the second transistor T2, the emitters being connected to the piece of equipment 2.

Of course, a first transistor and a second transistor of the PNP type may be used. In this case, the mounting of the transistors is reversed (not shown).

Thus, such a mounting is such that the control of the control circuit is not referenced relatively to the ground as this is the case conventionally. Thus, in the invention, one has a circuit for which the control is floating, referenced to the emitter and not to the ground, giving the possibility of simplifying the wiring during the use of the switch on the one hand and thus putting several switches in series on the other hand in order to be able to achieve a different logic function and attain a higher level of safety in the case of a fault.

This is further advantageous since this gives the possibility of mounting in series several control circuits in order to increase the safety. Indeed, in this case, a faulty control circuit may be compensated with another control circuit in series.

The circuit also comprises a diode D connected between the piece of electric equipment 2 and the voltage source 11, the diode D is biased in the same direction as the voltage source 11.

Further, the circuit comprises a first resistor R1 connected to the base of the first transistor T1, the first resistor R1 gives the possibility of applying the electric control signal CMD to the base of the first transistor T1.

Further, a second resistor R2 is connected between the base of the second transistor T2 and the collector of the second transistor T2.

Advantageously, the second transistor T2 is of the Darlington type. This has the advantage of limiting the bias current in its base in order to be able to increase the second resistor R2 and thereby reduce the leakage current of the switch in its 'open' state.

The operation of this circuit is identical with the one described in connection with FIG. 1. By considering the same example as previously, one has:

Starting Mode:

Only the diode D is active and lets through the current (from bottom to top). The transistors are thus mounted opposite to the direction of the voltage and no current crosses them.

Engine Started Mode

Only the diode D is active and lets through the current (from bottom to top). The transistors are thus mounted opposite the direction of the voltage and no current crosses them and this regardless of the value of the electric control signal CMD.

Slow Down or Normal Mode

The diode D is now opposed to the direction of the voltage and is therefore blocked. The electric control signal CMD is equal to CMD='1' (under the assumption that no engine fault is present) the current in the first resistor R1 gives the possibility of controlling the first transistor T1 in a "conducting" mode which will bypass the current provided through the second resistor R2 so as to cutoff the second transistor T2.

Default Mode

The diode D is now opposite the direction of the voltage and is therefore blocked. The electric control signal CMD is equal to '0' and therefore there is no longer any current in the first resistor R1 which opens the first transistor T1. The current provided by the second resistor R2 therefore passes into the base of the second transistor T2 which gives the possibility of closing the latter and therefore of leaving the current in the load.

The invention claimed is:

1. A control circuit of a piece of electric equipment, said control circuit receiving as an input a discrete electric control signal (CMD), the control circuit comprising a voltage (±V) source configured for powering the circuit according to a negative or positive voltage;

a normally closed switch in the absence of any discrete electric control signal (CMD) and configured for insulating the piece of electric equipment from the voltage source depending on the electric control signal (CMD), said switch being connected between the voltage source and the piece of electric equipment; the switch being sensitive to the discrete electric control signal (CMD) for a single voltage direction wherein the normally closed switch comprises a first PNP transistor (T1) controlled by the discrete electric control signal (CMD) and a second PNP transistor (T2), the collector of the first transistor (T1) being connected to the base of the second transistor (T2), the emitter of the first transistor (T1) being connected to the emitter of the second transistor (T2), the emitters being connected to the piece of equipment.

2. The control circuit according to claim 1, wherein the normally closed switch comprises a first resistor (R1) connected to the base of the first transistor (T1), said first resistor (R1) for applying the electric control signal (CMD) to said base of the first transistor (T1).

3. The control circuit according to claim 1, wherein the normally closed switch comprises a second resistor (R2) connected between the base of the second transistor (T2) and the collector of the second transistor (T2).

4. An electric power supply circuit according to claim 1, wherein the second transistor (T2) is a Darlington transistor.

5. The electric power supply circuit according to claim 1, comprising a device for controlling the direction of the voltage issued by the voltage source.

6. The electric power supply circuit according to claim 5, wherein the device for controlling the direction of the voltage issued by the voltage source is mounted in parallel on said voltage source.

7. An electric device for closing a fuel circuit of an aircraft powered by means of an electric power supply circuit according to claim 1.

8. A control circuit of a piece of electric equipment, said control circuit receiving as an input a discrete electric control signal (CMD), the control circuit comprising a voltage (±V) source configured for powering the circuit according to a negative or positive voltage;

a normally closed switch in the absence of any discrete electric control signal (CMD) and configured for insulating the piece of electric equipment from the voltage source depending on the electric control signal (CMD), said switch being connected between the voltage source and the piece of electric equipment; the switch being sensitive to the discrete electric control signal (CMD) for a single voltage direction wherein the normally closed switch comprises a first NPN transistor (T1) controlled by the discrete electric control signal (CMD) and a second NPN transistor (T2), the collector of the first transistor (T1) being connected to the base of the second transistor (T2), the emitter of the first transistor (T1) being connected to the emitter of the second transistor (T2), the emitters being connected to the piece of equipment.

* * * * *